US009446378B2

(12) United States Patent
Dannoux et al.

(10) Patent No.: US 9,446,378 B2
(45) Date of Patent: Sep. 20, 2016

(54) FLUIDIC MODULE PERMANENT STACK ASSEMBLIES AND METHODS

(71) Applicant: Corning Incorporated, Corning, NY (US)

(72) Inventors: Thierry Luc Alain Dannoux, Avon (FR); Sylvain Maxime F. Gremetz, Montereau Fault Yonne (FR); Olivier Lobet, Villiers sous Grez (FR); Ronan Tanguy, Grez sur Loing (FR)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 14/361,842

(22) PCT Filed: Nov. 30, 2012

(86) PCT No.: PCT/US2012/067177
§ 371 (c)(1),
(2) Date: May 30, 2014

(87) PCT Pub. No.: WO2013/082347
PCT Pub. Date: Jun. 6, 2013

(65) Prior Publication Data
US 2014/0369902 A1    Dec. 18, 2014

Related U.S. Application Data

(60) Provisional application No. 61/565,136, filed on Nov. 30, 2011.

(51) Int. Cl.
*B01J 19/32* (2006.01)
*B23P 19/10* (2006.01)
(Continued)

(52) U.S. Cl.
CPC ............. *B01J 19/32* (2013.01); *B01J 19/0093* (2013.01); *B23P 19/10* (2013.01); *B81C 3/001* (2013.01);
(Continued)

(58) Field of Classification Search
CPC ................ B01J 19/32; B01J 2219/328; B01J 2219/32425; B01J 2219/32441; B01J 2219/33275; B01J 2219/32213; B23P 19/10
USPC .................................... 422/601, 603; 29/469
See application file for complete search history.

(56) References Cited

U.S. PATENT DOCUMENTS 3,040,213 A * 6/1962 Byer et al. .................... 361/761
6,986,189 B2 * 1/2006 Kitahara ...................... 29/25.35
(Continued)

FOREIGN PATENT DOCUMENTS

EP          2457658 A1    5/2012
WO       2008030088       3/2008
(Continued)

*Primary Examiner* — Huy-Tram Nguyen
(74) *Attorney, Agent, or Firm* — Gregory V. Bean

(57) ABSTRACT

The present disclosure provides an assembled stack of fluidic modules comprising at least first and second fluidic modules assembled in a stacked configuration. The first fluidic module has first and second major planar surfaces and encloses a first fluidic passage extending therethrough from a first passage entrance to a first passage exit with the first passage exit located on the second major planar surface of the first fluidic module. The second fluidic module also has first and second major planar surfaces and encloses a second fluidic passage extending therethrough from a second passage entrance to a second passage exit, with the second passage entrance located on the first major planar surface of the second fluidic module. The second major planar surface of the first fluidic module and the first major planar surface of the second fluidic module are spaced apart and physically joined together by at least three separate glass or glass-ceramic pads fused therebetween, and the at least three pads include at least one pad having no through-hole and at least one pad having a through-hole, with the through-hole forming a sealed fluidic interconnection between the first fluidic passage and the second fluidic passage. A method of forming the assembled stack is also disclosed.

13 Claims, 5 Drawing Sheets

(51) Int. Cl.
*B01J 19/00* (2006.01)
*C03B 23/24* (2006.01)
*B81C 3/00* (2006.01)
*C03C 3/091* (2006.01)
*C03C 27/00* (2006.01)

(52) U.S. Cl.
CPC ............ *C03B 23/245* (2013.01); *C03C 3/091* (2013.01); *C03C 27/00* (2013.01); *B01J 2219/00786* (2013.01); *B01J 2219/00806* (2013.01); *B01J 2219/00808* (2013.01); *B01J 2219/00824* (2013.01); *B01J 2219/00831* (2013.01); *B01J 2219/328* (2013.01); *B01J 2219/32213* (2013.01); *B01J 2219/32275* (2013.01); *B01J 2219/32425* (2013.01); *B01J 2219/32441* (2013.01); *B81B 2201/058* (2013.01); *B81C 2201/019* (2013.01); *Y10T 29/49904* (2015.01)

(56) References Cited

U.S. PATENT DOCUMENTS

| | | |
|---|---|---|
| 7,261,824 B2 | 8/2007 | Schlautmann et al. |
| 7,341,966 B2 | 3/2008 | Marques |
| 2004/0152580 A1 | 8/2004 | Marques |
| 2009/0162265 A1 | 6/2009 | Poissy et al. |
| 2010/0068107 A1 | 3/2010 | Tanguy |
| 2012/0040448 A1 | 2/2012 | Gremetz et al. |
| 2012/0180884 A1* | 7/2012 | Brunello et al. .......... 137/561 R |
| 2012/0288417 A1 | 11/2012 | Bisson et al. |

FOREIGN PATENT DOCUMENTS

| | | |
|---|---|---|
| WO | 2008056975 | 5/2008 |
| WO | 2009002152 | 12/2008 |
| WO | 2011068753 A1 | 6/2011 |
| WO | 2012071178 A1 | 5/2012 |

* cited by examiner

FLUIDIC MODULE PERMANENT STACK ASSEMBLIES AND METHODS

CROSS-REFERENCE TO RELATED APPLICATIONS

This application claims the benefit of priority under 35 U.S.C. §371 of International Application Serial No. PCT/US12/67177, filed on Nov. 30, 2012, which, in turn, claims the benefit of priority of U.S. Provisional Application Ser. No. 61/565,136 filed Nov. 30, 2011 the content of which is relied upon and incorporated herein by reference in their entireties as if fully set forth below.

FIELD

The field of this disclosure is continuous flow reactors, particularly those employing glass or ceramic fluidic modules having generally planar major surfaces, and means and methods for stacking and fluidic sealing of such fluidic modules as part of a continuous flow reactor assembly.

BACKGROUND

Continuous flow reactors comprised of fluidic modules formed of glass or ceramic or similar materials generally involve a significant number of fluidic modules providing elementary functions such as mixing and residence time.

FIGS. 1 and 2 (prior art) are cross sections of an instance of a fluidic module 14 in which can be used. The fluidic module 14 may optionally be comprised of multiple substrates 220, generally at least four as shown at the top of the figure, but more may be included if desired, up to "k" total, as labeled at the left edge of FIG. 1. Between each adjacent pair of the multiple substrates 220, a layer 230 of the module 14 is defined, such that multiple layers 230 are present, generally at least three, and optionally more, with up to k−1 total layers, as labeled at the right edge of FIG. 1. The substrates 220 are joined to each other and supported relative to one another by walls 234 (for ease of viewing, not all labeled), some of which are cut by the cross section of the figure, as indicated by the cross-hatching. Inlet and outlet holes 264, 265 which may extend through one or more of the substrates 220, provide external access to a thermal control fluid path 240 defined in or through one or more of the layers 230, in this case through the two layers 232 of the layers 230. Alternative access routes, such as by holes or gaps (not shown) through walls 234, may be used in place of or in addition to holes 264, if desired.

FIG. 2 is another cross section of the module 14 of FIG. 1, taken in a plane different from but parallel to that of FIG. 1. In the cross section of FIG. 2 may be seen inlet and outlet holes 282, 283 which provide access through substrates 220 to a process fluid path 250 defined through one or more of the layers 230 of the device, in this case through the one layer 231. The process fluid path 250 may include one or more additional inlet ports or holes 282 (in a cross section not shown in FIGS. 1 and 2), such that two or more process fluids can be contacted and/or mixed and/or reacted together within the process fluid path 250. More than one outlet port or hole 283 may also be included on the output end of the process fluid path 250, such that a process fluid may be divided upon exiting the device 210, if desired.

Various materials and methods may be used to form the microstructures 14 or microfluidic devices 210 of the type shown in FIGS. 1 and 2, including methods that produce walls and flat portions or substrates simultaneously as one piece. Methods include, for instance, those disclosed and described in Patent No. EP1964817, entitled "Method for Making Microfluidic Devices and Devices Produced Thereof," and in Patent Publication No. US2007/0154666, entitled "Powder Injection Molding of Glass and Glass-Ceramics," and in U.S. Pat. No. 7,007,709, "Microfluidic Device And Manufacture Thereof."

Where longer residence time or larger capacity is needed, the numbers of layers "k" in a given module 14 may be increased. But it is desirable from design flexibility and cost standpoint to have a few designs of standard modules 14 having fewer layers in each module, and to use such standard modules, linked together, to form any needed reactor configurations. Where standard individual fluidic modules are used, they can be linked together by mechanical connectors employing O-ring seals. Such non-permanent fluidic module stacking still requires seals in between each modules and local compression, presenting additional cost and additional potential leakage points. For reduction of the number of interconnections and for compactness reasons, permanent connection and permanent stacking of individual fluidic modules is desirable.

The present disclosure provides a solution for permanent stacking of fluidic modules practical from both cost and performance standpoints, providing both fluidic sealing and structural support in a single process, resulting in a robust permanently and sealed stack of fluidic modules.

SUMMARY

According to one aspect of the present disclosure, a permanently assembled stack of fluidic modules is provided, the stack comprising at least first and second fluidic modules assembled in a stack with the first fluidic module having first and second major planar surfaces and enclosing a first fluidic passage fluidically connected to a first opening located on its second major planar surface, with the second fluidic module also having first and second major planar surfaces and enclosing a second fluidic passage fluidically connected to a second opening located on the first major planar surface of the second fluidic module (20b). At least one pad of a first glass or glass-ceramic material is fused between the fluidic modules so as to permanently connect the second major planar surface of the first fluidic module and the first major planar surface of the second fluidic module. The at least one pad (50) includes a through-hole positioned such that the through-hole forms a sealed fluidic interconnection between the first opening connected to the first fluidic passage and the second opening connected to the second fluidic passage and, a sheet of a second glass, glass-ceramic, or ceramic material positioned between the second major planar surface of the first fluidic module and the first major planar surface of the second fluidic module and surrounding the at least one pad.

Other further embodiments, features, and advantages of the present disclosure will be described below.

DETAILED DESCRIPTION

Figure 1:
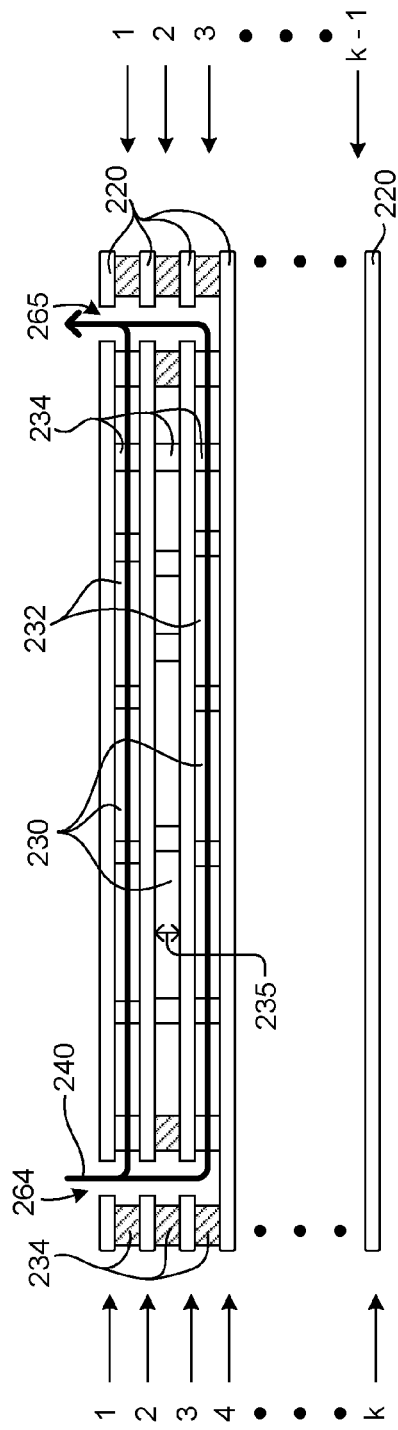
FIGS. 1 and 2 (prior art) are cross-sectional diagrams of fluidic modules of a type that may be used in the context of this disclosure.
Figure 2:
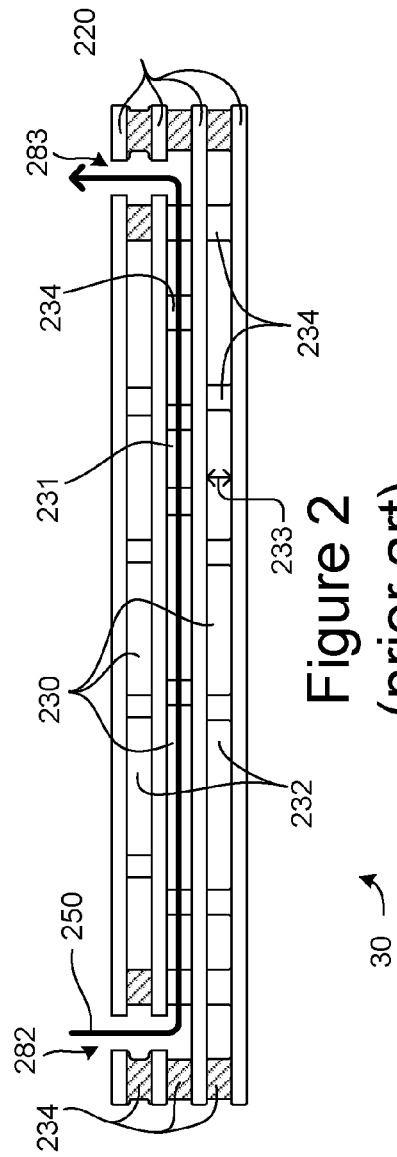

Reference will now be made in detail to the accompanying drawings which illustrate certain instances of the methods and devices described generally herein. Whenever possible, the same reference numerals will be used throughout the drawings to refer to the same or like parts.

Figure 3:
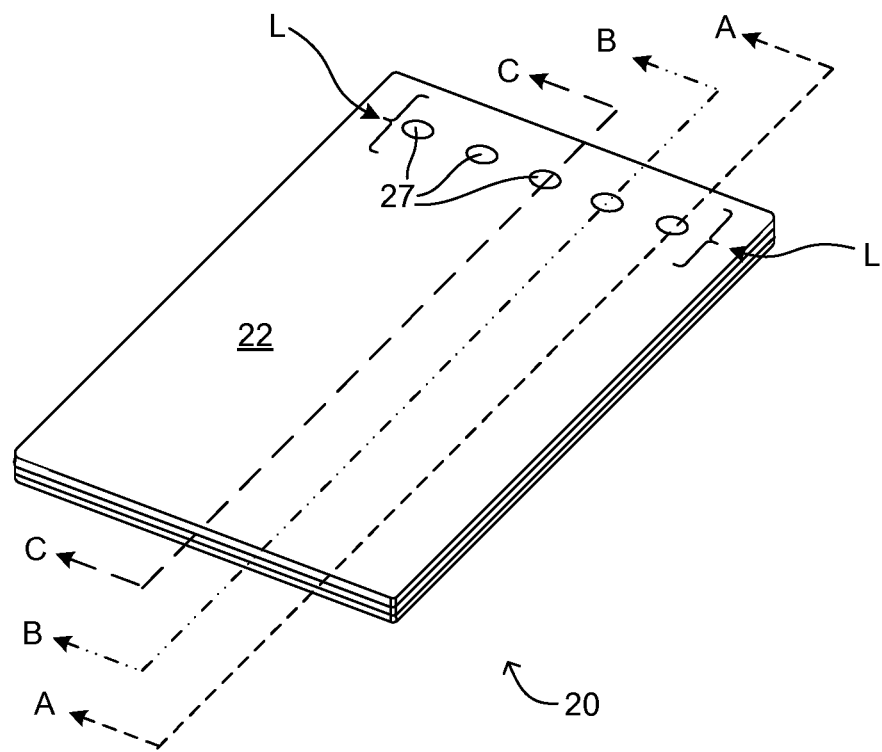
FIG. 3 is a perspective view of a fluidic module of one type useful in the context of the present disclosure.

FIG. 3 is a perspective view of a type of fluidic module 20 desirably used within the methods and resulting devices of the present disclosure. At least one, desirably multiple fluidic passages (not shown in FIG. 3) extend through the module 20, accessed via openings 27 positioned on a first major planar surface 22 (the upper major surface in the figure) of the module 20. The at least one, desirably multiple fluidic passages preferably pass out of the module 20 on a second major planar surface thereof (the lower major surface of the module 20 not visible in the perspective view of FIG. 3. The openings 27 are desirably all positioned at a set of standard locations L, or within a subset of these, and these are desirably located at concentrically with corresponding standard locations for openings on the second major planar surface, not visible in FIG. 3.

Figure 4:
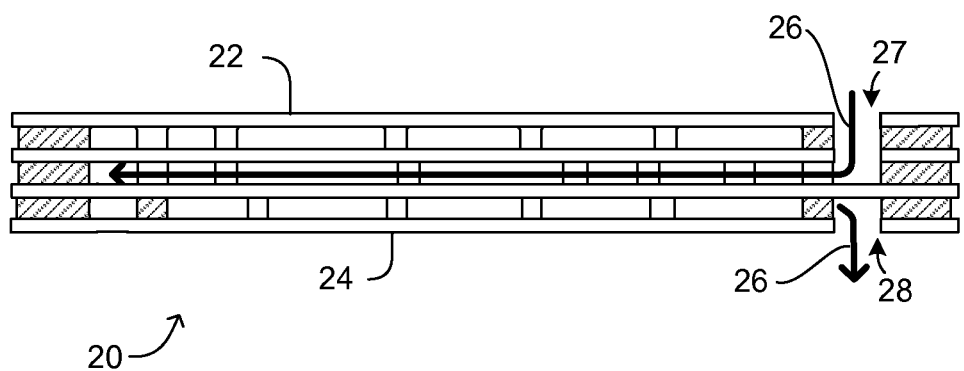
FIG. 4 is a cross section of an embodiment of the module of FIG. 3, taken along the line A in FIG. 3.

FIGS. 4-8 show cross-sectional views of aspects of various embodiments of a fluidic module similar to the one in FIG. 3. FIG. 4 shows one embodiment of a module 20 taken at the cross-sectional view "A" as indicated in FIG. 3, and in FIG. 4 may be seen an instance of one opening 27 having a corresponding concentrically located first opening 28 at a corresponding standard location on the second major planar surface 24 of the module 20. The module 20 encloses a first fluidic passage 26 fluidically connected to the first opening 28 on the second major planar surface 24, indicated by the bold arrow, and parts of which passage lie outside the plane of the figure.

Figure 5:
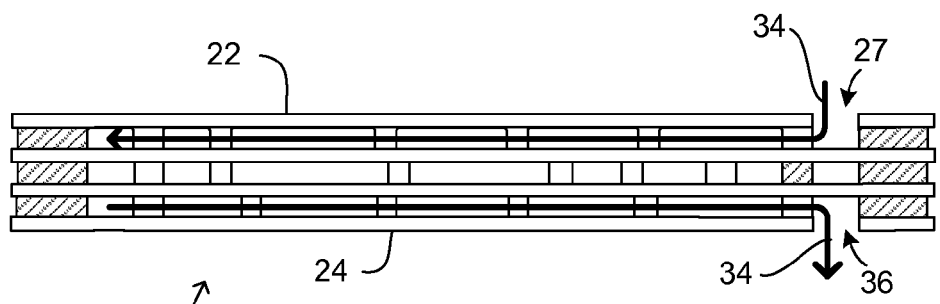
FIG. 5 is a cross section of the embodiment of FIG. 4, taken along the line B in FIG. 3.

FIG. 5 shows a cross-sectional view of the embodiment of a module 20 of FIG. 4, but taken at the line B indicated in FIG. 3. At this cross section may be seen another fluidic passage 34 enclosed within the module 20, the indicated passage path, traveling in the two outermost fluidic layers of the module 20, is typically useful for flowing a thermal control fluid therein. The fluidic passage 34 is connected to an additional opening 36 in the second major surface 24 of the module 20.

Figure 6:
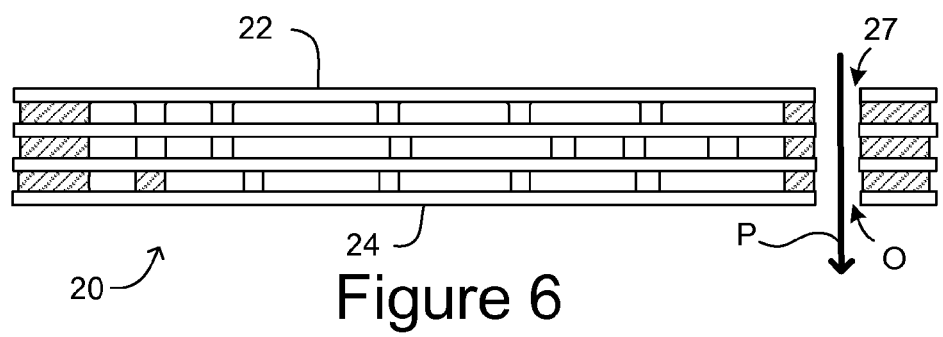
FIG. 6 is a cross section of the embodiment of FIGS. 4 and 5 taken along the line C in FIG. 3.

FIG. 6 shows a cross-sectional view of one alternative useful but optional with the embodiment of a module 20 of FIGS. 4 and 5, the cross-section taken at the line C indicated in FIG. 3. The cross-section of FIG. 6 shows yet another opening O in the second major planar surface 24 of the module 20, this opening connected to a pass-through fluidic passage P useful to pass fluid to a another module in if the module 20 is placed in a stack. This would allow for introduction of a reactant at a specific place later in flow path, for example, or might also allow for particularly intense cooling of a given module in the stack by means of a direct fluidic passage P to that given module.

Figure 7:
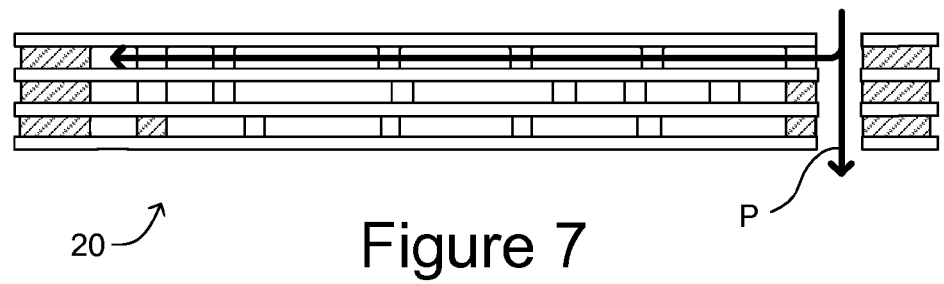
FIGS. 7 and 8 show an alternative embodiment of the module 20 of FIG. 3, in cross sections taken along lines B and C of FIG. 3, respectively.
Figure 8:
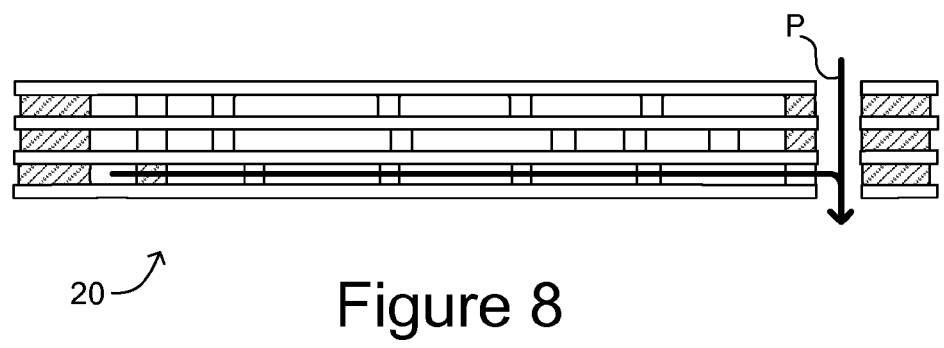

FIGS. 7 and 8 show an alternative embodiment of the module 20 of FIG. 3, in cross sections taken along lines B and C of FIG. 3, respectively. This embodiment shows how access to a fluidic passage within the module 20 may be combined with pass through passages P, such that multiple fluidic modules in a stack together may optionally be connected fluidically in parallel, rather than in series as in the passages shown in FIGS. 4 and 5. This may be particularly beneficial for fluidic passages intended for use with thermal control fluid, as amount of fluid that could pass each module per unit time, or per unit pressure drop, within a stack, would increase.

Figure 9:
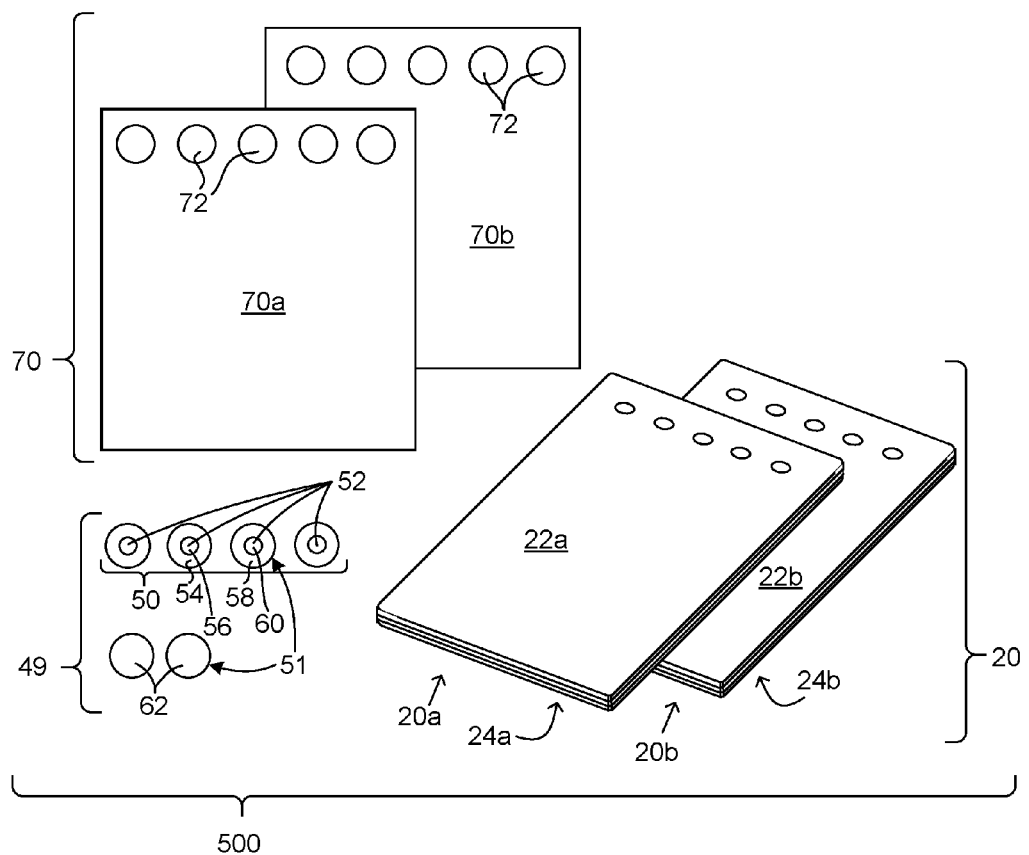
FIG. 9 is a combination plan and perspective view of components of a system or kit according to one aspect of the present disclosure.

As one embodiment, represented partly in perspective and partly in plan view in FIG. 9, a system or kit 500 is provided for forming and permanently assembling multiple microfluidic modules 20 into a fluidically connected stack, the system comprising multiple microfluidic modules (20a,20b) each having first and second major planar surfaces 22a,22b, 24a,24b (the second major planar surfaces 24a, 24b not visible in the figure); one or more enclosed fluidic passages (not shown) each respective passage accessible through respective openings through one or both of the first and second major planar surfaces (22a,22b,24a,24b). The kit or system 500 further comprises multiple glass or glass ceramic pads 49, including pads having a through hole (50,54,58) and optionally pads having no through hole (62), the pads having a characteristic perimeter shape (51), circular in this case. The system or kit 500 further comprises multiple thin sheets (70a,70b), each sheet having multiple through holes 72 matching the characteristic perimeter (51) of the multiple pads 49. The modules (20a,20b) and the sheets (70a,70b) in the kit are also are structured such that length and width dimensions of the major planar surfaces of the modules (20a,20b) are at least within 10% of length and width dimensions of the sheets (70a,70b). The modules (20a,20b) also have a set of standard locations (L) (as in FIG. 3) at which any openings are positioned, within the area of their respective major planar surfaces (22a,22b,24a,24b). Moreover, the positions of the through holes (72) through the sheets (70a,70b) are matched, in number and position, to the set of standard locations (L) at which any openings are positioned within the respective major planar surfaces (22a, 22b,24a,24b) of the modules (20a,20b). Also, the pads 49 have a thickness greater than a thickness of the sheets (70a, 70b) and are formed of a material having a softening point lower than a softening point of a material of which the sheets (70a,70b) are formed, and lower than a softening point of a material of which the modules (20a,20b) are formed.

A specifically presently preferred material for the pads 49 is a glass having the following composition, by mass percentage:

| Oxide | Weight % |
| --- | --- |
| SiO2 | 61-67 |
| B2O3 | 6.5-9 |
| Al2O3 | 9-12 |
| CaO | 3.5-5 |
| BaO | 12-15 | desirably also having a CTE in the range of from 31 to 40 10-7/° C. and a softening point in the range of from 930 to 960° C.

As another aspect of the present disclosure, a method is provided for permanently assembling a stack of fluidic modules. The method will be described with respect to the FIGS. 3-11, but with particular respect to FIG. 10 and FIG. 11, which show elevational views of the stack before and after permanent assembly, respectively.

Figure 10:
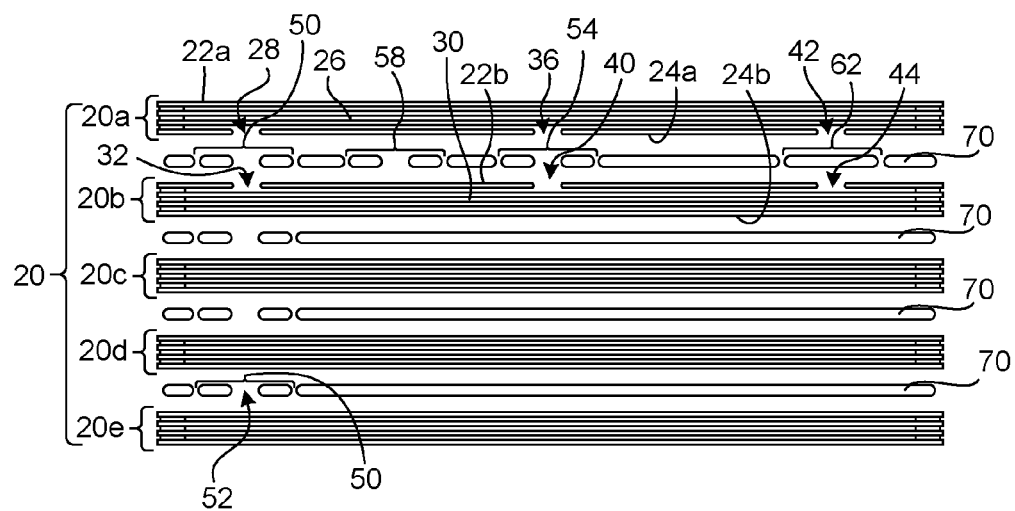
FIGS. 10 and 11, which show an elevational view of a permanent stack of fluidic modules, according to another aspect of the present disclosure, before and after permanent assembly, respectively
Figure 11:
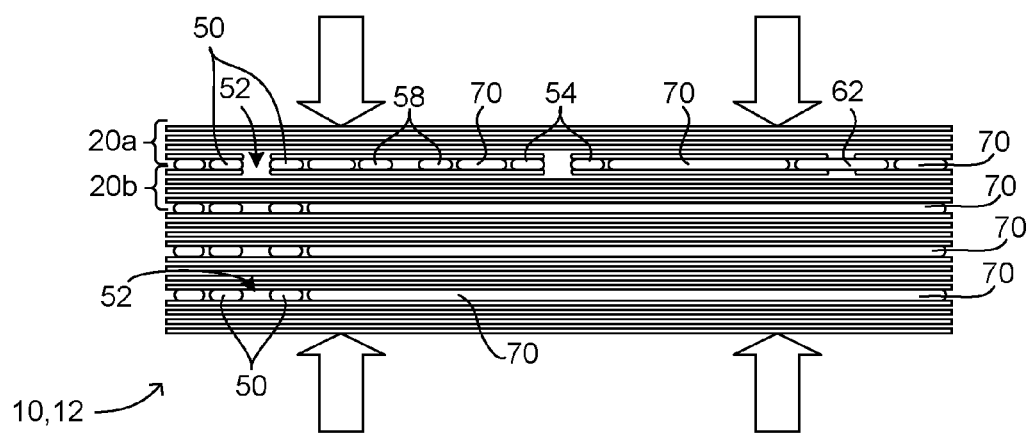

With particular reference to FIGS. 9, 10, and 11, the stack 10 comprises at least first and second fluidic modules (20a,20b), and the method comprises providing at least first and second fluidic modules (20a,20b), the first fluidic module (20a) having first and second major planar surfaces (22a,24a) and enclosing a first fluidic passage (26) fluidically connected to a first opening 28 located on the second major planar surface (24a) of the first fluidic module (20a), the second fluidic module (20b) also having first and second major planar surfaces (22b,24b) and enclosing a second fluidic passage (30) fluidically connected to a second opening (32) located on the first major planar surface (22b) of the second fluidic module (20b);

providing at least one pad (50) of a first glass or glass-ceramic material having a perimeter (51) and having a through-hole (52), the first glass or glass-ceramic material having a first softening point and a first thickness;

providing at least one sheet (70) of a second glass, glass-ceramic, or ceramic material, the sheet (70) having at least one through-hole (72) shaped to be able to contain the perimeter (51) of the at least one pad, (50) the second glass, glass-ceramic, or ceramic material having a second softening point and a second thickness less than the first thickness;

stacking the at least one pad (50) and the at least one sheet (70) and the first and second fluidic modules (20a,20b) together to form an assembled stack (12), with the at least one pad (50) and the at least one sheet (70) positioned between the second major planar surface (24a) of the first fluidic module (20a) and the first major planar surface (22b) of the second fluidic module (20b), with the through-hole (52) of the at least one pad (50) aligned with both the first and second openings (28,32), and with the at least one through-hole (72) in the at least one sheet (70) surrounding the perimeter (51) of the at least one pad (50);

heating the assembled stack (12) while applying pressure to the assembled stack (12) so as to permanently fuse the at least one pad (50) between the second major planar surface (24a) of the first fluidic module (20a) and the first major planar surface (22b) of the second fluidic module (20b) so as to form a permanently assembled stack (10).

Desirably, the first material used in the step of providing at least one pad (50) and the second material used in the step of providing at least one sheet (70) are selected such that the first softening point is less than the second softening point.

As a further alternative aspect, the step of providing at least first and second fluidic modules (20a,20b) may further include providing a first fluidic module (20a) having a second major planar surface (24a) formed of a third material and providing a providing a second fluidic module (20b) having a first major planar surface (22b) also formed of said third material, said third material having a third softening point greater than the first softening point.

As another alternative aspect, the first fluidic module (20a) may enclose a third fluidic passage 34 fluidically connected to a third opening (36) located on the second major planar surface (24a) of the first fluidic module (20a) and the second fluidic module (20b) may enclose a fourth fluidic passage (38) fluidically connected to a fourth opening (40) located on the first major planar surface (22b) of the second fluidic module (20b). In this alternative, the method further comprises providing a second pad (54) of the first glass or glass-ceramic material, the second pad (54) having a through-hole (56), and the step of stacking further comprises stacking the second pad (54) between the second major planar surface (24a) of the first fluidic module (20a) and the first major planar surface (22b) of the second fluidic module (20b) with the through-hole (56) of the second pad (54) aligned with the third opening (36) and the fourth opening (40).

According to another aspect of the present disclosure, a permanently assembled stack (10) of fluidic modules (20) is provided. The stack 10 includes at least first and second fluidic modules (20a,20b)) assembled in a stack (10). The first fluidic module has first and second major planar surfaces (22a,24a) and encloses a first fluidic passage (26) fluidically connected to a first opening (28) located on the second major planar surface (24a) of the first fluidic module (20a). The second fluidic module (20b) also has first and second major planar surfaces (22b,24b) and encloses a second fluidic passage (30) fluidically connected to a second opening (32) located on the first major planar surface (22b) of the second fluidic module (20b).

The stack 10 further includes at least one pad (50) of a first glass or glass-ceramic material, the at least one pad (50) being fused between, so as to permanently connect, the second major planar surface (24a) of the first fluidic module (20a) and the first major planar surface (22b) of the second fluidic module (20b), the at least one pad (50) including a through-hole (52) positioned such that the through-hole (52) forms a sealed fluidic interconnection between the first opening (28) connected to the first fluidic passage (26) and the second opening (32) connected to the second fluidic passage (30). The stack 10 also includes a sheet (70 70a, 70b) of a second glass, glass-ceramic, or ceramic material positioned between the second major planar surface (24a) of the first fluidic module (20a) and the first major planar surface (22b) of the second fluidic module (20b) and surrounding the at least one pad (50). Further, the first material has a first softening point and the second material has a second softening point, and the first softening point is less than the second softening point.

As one potentially desirable alternative of sub-version of the permanent stack 10, the second major planar surface (24a) of the first fluidic module (20a) and the first major planar surface (22b) of the second fluidic module (20b) may be formed of a third material having a third softening point, and wherein the first softening point is less than the third softening point. Of course, the third material may optionally be the same as the second material and the third softening point may be the same as the second softening point.

As another alternative combinable with any of the above, the stack (10) according may have a first fluidic module (20a) that encloses a third fluidic passage (34) fluidically connected to a third opening (36) located on the second major planar surface (24a) of the first fluidic module (20a), and the second fluidic module (20b) may enclose a fourth fluidic passage (38) fluidically connected to a fourth opening (40) located on the first major planar surface (22b) of the second fluidic module (20b). A second pad (54) of a first glass or glass-ceramic material is then desirably fused between the second major planar surface (24a) of the first fluidic module (20a) and the first major planar surface (22b) of the second fluidic module (20b). The second pad (54) then desirably includes a through-hole (56) positioned such that the through-hole (56) forms a second sealed fluidic interconnection between the third opening (36) and the fourth opening (38).

As another optional variation applicable to all of the above, an additional pad (58) of the first glass or glass-ceramic material may be fused between the second major planar surface (24a) of the first fluidic module (20a) and the first major planar surface (22b) of the second fluidic module (20b), the additional pad (58) including a through-hole (60) and not being positioned between openings in the first and second fluidic modules (20a,20b). Such a pad provides mechanical support without providing fluidic interconnection.

As yet one more optional alternative compatible with most embodiments mentioned, the stack (10) may include a first fluidic module (20a) with an additional opening (42) in the second major planar surface (24a) of the first fluidic module (20a), and the second fluidic module (20b) may has a corresponding additional opening (44) located in the first major planar surface (22b) of the second fluidic module (20b). In this embodiment, an additional pad (62) of the first glass or glass-ceramic material is fused between the second major planar surface (24a) of the first fluidic module (20a) and the first major planar surface (22b) of the second fluidic module (20b), the additional pad (62) not including a through-hole and being positioned such that the additional pad (62) forms a seal between the additional opening (42) and the corresponding additional opening (44), preventing fluid communication therebetween.

The methods and/or devices disclosed herein are generally useful in performing any process that involves mixing, separation, extraction, crystallization, precipitation, or otherwise processing fluids or mixtures of fluids, including multiphase mixtures of fluids—and including fluids or mixtures of fluids including multiphase mixtures of fluids that also contain solids—within a microstructure. The processing may include a physical process, a chemical reaction defined as a process that results in the interconversion of organic, inorganic, or both organic and inorganic species, a biochemical process, or any other form of processing. The following non-limiting list of reactions may be performed with the disclosed methods and/or devices: oxidation; reduction; substitution; elimination; addition; ligand exchange; metal exchange; and ion exchange. More specifically, reactions of any of the following non-limiting list may be performed with the disclosed methods and/or devices: polymerization; alkylation; dealkylation; nitration; peroxidation; sulfoxidation; epoxidation; ammoxidation; hydrogenation; dehydrogenation; organometallic reactions; precious metal chemistry/homogeneous catalyst reactions; carbonylation; thiocarbonylation; alkoxylation; halogenation; dehydrohalogenation; dehalogenation; hydroformylation; carboxylation; decarboxylation; amination; arylation; peptide coupling; aldol condensation; cyclocondensation; dehydrocyclization; esterification; amidation; heterocyclic synthesis; dehydration; alcoholysis; hydrolysis; ammonolysis; etherification; enzymatic synthesis; ketalization; saponification; isomerisation; quaternization; formylation; phase transfer reactions; silylations; nitrile synthesis; phosphorylation; ozonolysis; azide chemistry; metathesis; hydrosilylation; coupling reactions; and enzymatic reactions.

It will be apparent to those skilled in the art that various modifications and variations can be made without departing from the spirit or scope of the invention.

What is claimed is:

1. A permanently assembled stack (10) of fluidic modules (20) comprising:
   at least first and second fluidic modules (20a,20b)) assembled in a stack (10), the first fluidic module (20a) having first and second major planar surfaces (22a,24a) and enclosing a first fluidic passage (26) fluidically connected to a first opening (28) located on the second major planar surface (24a) of the first fluidic module (20a), the second fluidic module (20b) also having first and second major planar surfaces (22b,24b) and enclosing a second fluidic passage (30) fluidically connected to a second opening (32) located on the first major planar surface (22b) of the second fluidic module (20b);
   at least one pad (50) of a first glass or glass-ceramic material, the at least one pad (50) being fused between, so as to permanently connect, the second major planar surface (24a) of the first fluidic module (20a) and the first major planar surface (22b) of the second fluidic module (20b), the at least one pad (50) including a through-hole (52) positioned such that the through-hole (52) forms a sealed fluidic interconnection (80) between the first opening (28) connected to the first fluidic passage (26) and the second opening (32) connected to the second fluidic passage (30); and
   a sheet (70) of a second glass, glass-ceramic, or ceramic material positioned between the second major planar surface (24a) of the first fluidic module (20a) and the first major planar surface (22b) of the second fluidic module (20b) and surrounding the at least one pad (50),
   wherein the first material has a first softening point and the second material has a second softening point, and the first softening point is less than the second softening point.

2. The stack (10) according to claim 1 wherein the first material comprises a glass having the following composition, by mass percentage,

| | |
|---|---|
| SiO2 % | 61-67 |
| B2O3 % | 6.5-9 |
| Al2O3 % | 9-12 |
| CaO % | 3.5-5 |
| BaO % | 12-15 | and having a CTE in the range of from 31 to $40 \times 10^{-7}/°$ C. and a softening point in the range of from 930 to 960° C.

3. The stack (10) according to claim 1 wherein the second major planar surface (24a) of the first fluidic module (20a) and the first major planar surface (22b) of the second fluidic module (20b) are formed of a third material having a third softening point, and wherein the first softening point is less than the third softening point.

4. The stack (10) according to claim 3 wherein the third material is the same as the second material and the third softening point is the same as the second softening point.

5. The stack (10) according to claim 1 wherein the first fluidic module (20a) encloses a third fluidic passage (34) fluidically connected to a third opening (36) located on the second major planar surface (24a) of the first fluidic module (20a), and the second fluidic module (20b) encloses a fourth fluidic passage (38) fluidically connected to a fourth opening (40) located on the first major planar surface (22b) of the second fluidic module (20b), and wherein a second pad (54) of a first glass or glass-ceramic material is fused between the second major planar surface (24a) of the first fluidic module (20a) and the first major planar surface (22b) of the second fluidic module (20b), the second pad (54) including a through-hole (56) positioned such that the through-hole (56) forms a second sealed fluidic interconnection between the third opening (36) and the fourth opening (38).

6. The stack (10) according to claim 1 wherein an additional pad (58) of the first glass or glass-ceramic material is fused between the second major planar surface (24a) of the first fluidic module (20a) and the first major planar surface (22b) of the second fluidic module (20b), the additional pad (58) including a through-hole (60) and not being positioned between openings in the first and second fluidic modules (20a,20b).

7. The stack (10) according to claim 1 wherein the first fluidic module (20a) has an additional opening (42) in the second major planar surface (24a) of the first fluidic module (20a), and the second fluidic module (20b) has a corresponding additional opening (44) located in the first major planar surface (22b) of the second fluidic module (20b), and wherein an additional pad (62) of the first glass or glass-ceramic material is fused between the second major planar surface (24a) of the first fluidic module (20a) and the first major planar surface (22b) of the second fluidic module (20b), the additional pad (62) not including a through-hole and being positioned such that the additional pad (62) forms a seal between the additional opening (42) and the corresponding additional opening (44), preventing fluid communication therebetween.

8. A method of permanently assembling a stack of fluidic modules, the stack 10 comprising at least first and second fluidic modules (20a,20b), the method comprising:
providing at least first and second fluidic modules (20a, 20b), the first fluidic module (20a) having first and second major planar surfaces (22a,24a) and enclosing a first fluidic passage (26) fluidically connected to a first opening 28 located on the second major planar surface (24a) of the first fluidic module (20a), the second fluidic module (20b) also having first and second major planar surfaces (22b,24b) and enclosing a second fluidic passage (30) fluidically connected to a second opening (32) located on the first major planar surface (22b) of the second fluidic module (20b);
providing at least one pad (50) of a first glass or glass-ceramic material having a perimeter (51) and having a through-hole (52), the first glass or glass-ceramic material having a first softening point and a first thickness;
providing at least one sheet (70) of a second glass, glass-ceramic, or ceramic material, the sheet (70) having at least one through-hole (72) shaped to be able to contain the perimeter (51) of the at least one pad, (50) the second glass, glass-ceramic, or ceramic material having a second softening point and a second thickness less than the first thickness;
stacking the at least one pad (50) and the at least one sheet (70) and the first and second fluidic modules (20a,20b) together to form an assembled stack (12), with the at least one pad (50) and the at least one sheet (70) positioned between the second major planar surface (24a) of the first fluidic module (20a) and the first major planar surface (22b) of the second fluidic module (20b), with the through-hole (52) of the at least one pad (50) aligned with both the first and second openings (28,32), and with the at least one through-hole (72) in the at least one sheet (70) surrounding the perimeter (51) of the at least one pad (50);
heating the assembled stack (12) while applying pressure to the assembled stack (12) so as to permanently fuse the at least one pad (50) between the second major planar surface (24a) of the first fluidic module (20a) and the first major planar surface (22b) of the second fluidic module (20b) so as to form a permanently assembled stack (10).

9. The method according to claim 8 wherein the step of providing at least one pad (50) of a first glass or glass-ceramic material further comprises providing at least one pad (50) of a first glass or glass-ceramic material wherein said first glass or glass-ceramic material comprises a glass having the following composition, by mass percentage,

| | |
|---|---|
| SiO2 % | 61-67 |
| B2O3 % | 6.5-9 |
| Al2O3 % | 9-12 |
| CaO % | 3.5-5 |
| BaO % | 12-15 | and having a CTE in the range of from 31 to $40 \times 10^{-7}$/° C. and a softening point in the range of from 930 to 960° C.

10. The method according to claim 8 wherein the first material used in the step of providing at least one pad (50) and the second material step used in the step of providing at least one sheet (70) are selected such that the first softening point is less than the second softening point.

11. The method according to claim 8 wherein the step of providing at least first and second fluidic modules (20a,20b) further comprises providing a first fluidic module (20a) having a second major planar surface (24a) formed of a third material and providing a providing a second fluidic module (20b) having a first major planar surface (22b) also formed of said third material, said third material having a third softening point greater than the first softening point.

12. The method according to claim 8 wherein the step of providing at least first and second fluidic modules (20a,20b) comprises providing a first fluidic module (20a) enclosing a third fluidic passage 34 fluidically connected to a third opening (36) located on the second major planar surface (24a) of the first fluidic module (20a) and providing a second fluidic module (20b) enclosing a fourth fluidic passage (38) fluidically connected to a fourth opening (40) located on the first major planar surface (22b) of the second fluidic module (20b), the method further comprising providing a second pad (54) of the first glass or glass-ceramic material, the second pad (54) having a through-hole (56), and wherein the step of stacking further comprises stacking the second pad (54) between the second major planar surface (24a) of the first fluidic module (20a) and the first major planar surface (22b) of the second fluidic module (20b) with the through-hole (56) of the second pad (54) aligned with the third opening (36) and the fourth opening (40).

13. A system or kit for forming and permanently assembling multiple microfluidic modules into a fluidically connected stack 10, the system comprising:
multiple microfluidic modules (20a,20b) each having:
first and second major planar surfaces (22a,22b,24A, 24B),
one or more enclosed fluidic passages (26,30,34,38), each respective passage accessible through respective openings (28,32,36,40) through one or both of the first and second major planar surfaces (22a,22b, 24a,24b),
multiple glass or glass ceramic pads (50,54,58), including pads having a through hole (50,54,58) and optionally pads having no through hole (62), the pads (50,54,58, 62) having a characteristic perimeter shape (51); and
multiple thin sheets (70,70a), each sheet having multiple through holes (72) matching the characteristic perimeter (51) of the multiple pads (50,54,58,62);
wherein the modules (20a,20b) and the sheets (70a,70b) are structured such that length and width dimensions of the major planar surfaces of the modules (20a,20b) are at least within 10% of length and width dimensions of the sheets (70*a*,70*b*), and wherein the modules (20*a*,20*b*) have a set of standard locations (L) at which any openings are positioned, within the area of their respective major planar surfaces (22*a*,22*b*,24*a*,24*b*), and wherein positions of the through holes (72) through the sheets (70*a*,70*b*) are matched, in number and position, to the set of standard locations (L) at which any openings are positioned within the respective major planar surfaces (22*a*,22*b*,24*a*,24*b*) of the modules (20*a*,20*b*), and wherein the pads 50,54,58,62) (1) have a thickness greater than a thickness of the sheets (70*a*, 70*b*) and (2) are formed of a material having a softening point lower than a softening point of a material of which the sheets (70*a*,70*b*) are formed, and lower than a softening point of a material of which the modules (20*a*,20*b*) are formed.

* * * * *